(12) United States Patent
Hohage et al.

(10) Patent No.: US 7,994,072 B2
(45) Date of Patent: Aug. 9, 2011

(54) STRESS TRANSFER BY SEQUENTIALLY PROVIDING A HIGHLY STRESSED ETCH STOP MATERIAL AND AN INTERLAYER DIELECTRIC IN A CONTACT LAYER STACK OF A SEMICONDUCTOR DEVICE

(75) Inventors: Joerg Hohage, Dresden (DE); Michael Finken, Dresden (DE); Ralf Richter, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 319 days.

(21) Appl. No.: 12/108,622

(22) Filed: Apr. 24, 2008

(65) Prior Publication Data

US 2009/0108335 A1    Apr. 30, 2009

(30) Foreign Application Priority Data

Oct. 31, 2007    (DE) .......................... 10 2007 052 051

(51) Int. Cl.
*H01L 21/469*    (2006.01)
(52) U.S. Cl. ........................ 438/783; 257/369
(58) Field of Classification Search .................. 438/783; 257/369
See application file for complete search history.

(56) References Cited

U.S. PATENT DOCUMENTS

| 7,238,578 B2 * | 7/2007 | Burbach et al. ............... 438/275 |
| 2005/0214998 A1 * | 9/2005 | Chen et al. .................... 438/199 |
| 2006/0027924 A1 | 2/2006 | Chen et al. .................... 257/751 |
| 2006/0046400 A1 | 3/2006 | Burbach et al. ............... 438/282 |
| 2006/0091471 A1 * | 5/2006 | Frohberg et al. ............... 257/369 |
| 2006/0094215 A1 | 5/2006 | Frohberg et al. ............... 438/592 |
| 2006/0226490 A1 | 10/2006 | Burnett et al. ................. 257/365 |
| 2007/0018203 A1 * | 1/2007 | Atanackovic et al. ......... 257/254 |
| 2007/0020838 A1 | 1/2007 | Zhu et al. ...................... 438/199 |
| 2007/0096195 A1 | 5/2007 | Hoentschel et al. ........... 257/315 |
| 2007/0096220 A1 | 5/2007 | Kim et al. ...................... 257/382 |

FOREIGN PATENT DOCUMENTS

DE    10 2004 031 744 A1    6/2004

OTHER PUBLICATIONS

Translation of Official Communication from German Patent Office for German Patent Application No. 10 2007 052 051.6-33 dated Jul. 5, 2008.
PCT Search Report and Written Opinion from PCT/US2008/012195 dated Mar. 5, 2010.

* cited by examiner

*Primary Examiner* — N Drew Richards
*Assistant Examiner* — Yu-Hsi Sun
(74) *Attorney, Agent, or Firm* — Williams, Morgan & Amerson, P.C.

(57) ABSTRACT

By forming two or more individual dielectric layers of high intrinsic stress levels with intermediate interlayer dielectric material, the limitations of respective deposition techniques, such as plasma enhanced chemical vapor deposition, may be respected while nevertheless providing an increased amount of stressed material above a transistor element, even for highly scaled semiconductor devices.

23 Claims, 12 Drawing Sheets

STRESS TRANSFER BY SEQUENTIALLY PROVIDING A HIGHLY STRESSED ETCH STOP MATERIAL AND AN INTERLAYER DIELECTRIC IN A CONTACT LAYER STACK OF A SEMICONDUCTOR DEVICE

BACKGROUND OF THE INVENTION

1. Field of the Invention

Generally, the present disclosure relates to the field of integrated circuits, and, more particularly, to field effect transistors and manufacturing techniques on the basis of stressed dielectric layers formed above the transistors used for generating a desired type of strain in channel regions of transistors.

2. Description of the Related Art

Integrated circuits are typically comprised of a large number of circuit elements located on a given chip area according to a specified circuit layout, wherein, in complex circuits, the field effect transistor represents one predominant circuit element. Generally, a plurality of process technologies are currently practiced, wherein, for complex circuitry based on field effect transistors, such as microprocessors, storage chips and the like, CMOS technology is currently one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors. Thus, the reduction of the channel length, and associated therewith the reduction of the channel resistivity, may be a dominant design criterion for accomplishing an increase in the operating speed of the integrated circuits.

The shrinkage of the transistor dimensions, however, involves a plurality of issues associated therewith that have to be addressed so as to not unduly offset the advantages obtained by steadily decreasing the channel length of MOS transistors. One issue associated with reduced gate lengths is the occurrence of so-called short channel effects, which may result in a reduced controllability of the channel conductivity. Short channel effects may be countered by certain design techniques, some of which, however, may be accompanied by a reduction of the channel conductivity, thereby partially offsetting the advantages obtained by the reduction of critical dimensions.

In view of this situation, it has been proposed to enhance device performance of the transistor elements not only by reducing the transistor dimensions but also by increasing the charge carrier mobility in the channel region for a given channel length, thereby increasing the drive current capability and thus transistor performance. For example, the lattice structure in the channel region may be modified, for instance by creating tensile or compressive strain therein, which results in a modified mobility for electrons and holes, respectively. For example, creating tensile strain in the channel region of a silicon layer having a standard crystallographic configuration may increase the mobility of electrons, which, in turn, may directly translate into a corresponding increase of the conductivity of N-type transistors. On the other hand, compressive strain in the channel region may increase the mobility of holes, thereby providing the potential for enhancing the performance of P-type transistors.

One efficient approach in this respect is a technique that enables the creation of desired stress conditions within the channel region of different transistor elements by adjusting the stress characteristics of a dielectric layer stack that is formed above the basic transistor structure. The dielectric layer stack typically comprises one or more dielectric layers which may be located close to the transistor and which may also be used in controlling a respective etch process in order to form contact openings to the gate and drain and source terminals. Therefore, an effective control of mechanical stress in the channel regions, i.e., effective stress engineering, may be accomplished by individually adjusting the internal stress of these layers, which may also be referred to as contact etch stop layers, and by positioning a contact etch stop layer having an internal compressive stress above a P-channel transistor while positioning a contact etch stop layer having an internal tensile strain above an N-channel transistor, thereby creating compressive and tensile strain, respectively, in the respective channel regions.

Typically, the contact etch stop layer is formed by plasma enhanced chemical vapor deposition (PECVD) processes above the transistor, i.e., above the gate structure and the drain and source regions, wherein, for instance, silicon nitride may be used, due to its high etch selectivity with respect to silicon dioxide, which is a well-established interlayer dielectric material. Furthermore, PECVD silicon nitride may be deposited with a high intrinsic stress, for example, up to 2 Giga Pascal (GPa) or significantly higher of compressive stress and up to 1 GPa and significantly higher of tensile stress, wherein the type and the magnitude of the intrinsic stress may be efficiently adjusted by selecting appropriate deposition parameters. For example, ion bombardment, deposition pressure, substrate temperature, gas flow rates and the like represent respective parameters that may be used for obtaining the desired intrinsic stress.

During the formation of the two types of stressed layers, conventional techniques may suffer from reduced efficiency when device dimensions are increasingly scaled by using the 65 nm technology, and even further advanced approaches, due to the limited conformal deposition capabilities of the deposition process involved, which may result in respective process non-uniformities during subsequent process steps for patterning the stressed layer and forming contact openings, as will be explained in more detail with reference to FIGS. 1a-1c.

FIG. 1a schematically illustrates a cross-sectional view of a semiconductor device 100 in a certain manufacturing stage for forming stress-inducing layers above a first device area 120A and a second device area 120B. The first and second device areas 120A, 120B, which typically represent respective transistor elements, may be formed above a substrate 101 comprising a semiconductor layer 102, such as a silicon-based layer, which may be separated from the substrate 101 by an appropriate buried insulating layer if a silicon-on-insulator (SOI) configuration is considered. In the example shown, the first and second device areas 120A, 120B may comprise a plurality of transistor elements with a lateral distance according to the design rules of the technology under consideration. The transistors in the first and second device areas 120A, 120B may comprise a gate electrode 121 formed on a respective gate insulation layer, which separates the gate electrode 121 from a corresponding channel region 124, which is laterally located between respective drain/source regions 125. Furthermore, a sidewall spacer structure 122 may be formed on sidewalls of the gate electrode 121. Typically, metal silicide regions (not shown) may be provided in the drain and source regions 125 and the gate electrodes 121 in order to enhance the conductivity of these areas. The semiconductor device 100 may represent an advanced device, in which critical dimensions, such as the gate length, i.e., in FIG. 1a, the horizontal extension of the gate electrodes 121, may be approximately 50 nm or significantly less. Consequently, a distance between respective transistor elements, i.e., the lateral distance between neighboring sidewall spacer structures 122 of closely spaced transistor elements, may be approximately 100 nm or even less, wherein, depending on the device configuration, in dense device areas, a plurality of closely spaced circuit elements may be provided.

It should be appreciated that the first and second device regions 120A, 120B may be separated by an appropriate isolation structure (not shown) if required. Furthermore, in the manufacturing stage shown in FIG. 1a, a silicon nitride layer 130 comprising a high intrinsic stress may be formed above the first and second device areas 120A, 120B followed by an etch indicator layer 131 comprised of silicon dioxide. It should be appreciated that, if required, an etch stop layer, such as a silicon dioxide layer of appropriate thickness and density, may be provided between the silicon nitride layer 130 and the respective transistor elements in the first and second device areas 120A, 120B.

As is evident from FIG. 1a, due to the reduced spacing between neighboring transistor elements, the silicon nitride layer 130 may define a respective surface topography in which tapered recesses, also referred to as seams 132, may be formed between the closely spaced transistor elements, since the spacing between the transistor elements may be in the order of two times a layer thickness of the silicon nitride layer 130, which, in combination with the limited conformal fill behavior, may even result in corresponding defects, such as voids 132A and the like. Moreover, due to the pronounced surface topography at the seams 132, the silicon dioxide layer 131 may have a significantly increased thickness at this area due to locally different deposition conditions compared to other areas, which may further contribute to etch non-uniformities during the subsequent patterning of the layer 130.

Furthermore, in this manufacturing stage, the semiconductor device 100 may comprise a resist mask 103 exposing the first device area 120A, while covering the second device region 120B. In this case, it may be assumed that the intrinsic stress of the silicon nitride layer 130 may be appropriately selected so as to enhance the transistor performance in the second device area 120B.

A typical process flow for forming the semiconductor device 100 as shown in FIG. 1a may comprise the following processes. The gate electrodes 121 and the gate insulation layers may be formed and patterned on the basis of well-established process techniques including advanced photolithography, deposition, oxidation and etch techniques. Thereafter, the drain and source regions 125 may be formed in combination with the sidewall spacer structures 122 on the basis of well-established deposition, anisotropic etch processes and implantation sequences in order to establish the desired vertical and lateral dopant profile. Thereafter, respective silicide regions may be formed, if required, on the basis of well-established techniques. Next, if required, a corresponding silicon dioxide etch stop layer may be formed followed by the deposition of the silicon nitride layer 130. During the deposition of the silicon nitride material, respective process parameters, such as composition of carrier gases and reactive gases, substrate temperature, deposition pressure and, in particular, ion bombardment during the deposition, may significantly influence the finally obtained intrinsic stress of the material as deposited with respect to the underlying materials. Thus, by selecting appropriate parameter values, a high degree of intrinsic stress, such as up to 2 GPa and even more of compressive stress, up to 1 GPa or even significantly higher of tensile stress, may be created to enhance the performance of the transistor in the first device area 120A. Due to the less pronounced conformality of the silicon nitride deposition process above a certain layer thickness and for increased aspect ratios, as may occur in highly scaled devices caused by the reduced distance between the neighboring transistor elements at moderately dimensioned gate heights in densely packed device areas, as shown, the silicon nitride material may merge in the lateral growth direction between closely spaced transistor elements, thereby forming the respective seam 131 or respective overhangs may form, thereby resulting in the void 132A. Thus, in the subsequent deposition of the silicon dioxide layer 132, the local deposition conditions at the seam 131 may result in a non-uniformity of the layer thickness, thereby creating a locally significantly enhanced silicon dioxide thickness, which may even amount to a thickness of up to three to four times the thickness at areas distant from the seam 131. On the other hand, the void 132A may give rise to respective etch non-uniformities in a contact etch process to be performed in a later stage.

After the deposition of the silicon dioxide layer 132, the resist mask 103 may be formed on the basis of well-established photolithography techniques. Next, an appropriately designed etch process may be performed in order to remove a portion of the layers 130 and 131 from the second device area 120B. During the corresponding etch process, the silicon dioxide material of the layer 131 may be removed first followed by a selective etch process for removing the material of the silicon nitride layer 130, wherein the corresponding etch process may be controlled on the basis of an etch stop layer, if required. Due to the significantly increased layer thickness of the silicon dioxide layer 131 at the seam 132, the material may not be completely removed during the etch process when removing the layer 131, thereby significantly blocking the selective etch chemistry during the subsequent etch process for removing the exposed portion of the silicon nitride layer 130.

Consequently, respective material residuals may remain between the transistors in the first device area 120A, which may result in respective non-uniformities during the further processing, for instance during the deposition of a further dielectric layer of high intrinsic stress designed to enhance the transistor performance of the transistors in the first device area 120A.

FIG. 1b schematically illustrates the semiconductor device 100 at a further advanced manufacturing stage. As shown, a second dielectric layer 140 may be formed above the first and second device areas 120A, 120B, with a corresponding material residual, also referred to as 132 and consisting of material of the layer 131 and 130, while the respective defects, that is, a void 132A, may still be present in the second device area 120B. Consequently, due to the material residual 132, which may be comprised different materials and may have a different type of intrinsic stress compared to the surrounding material of the layer 140, as previously explained, the respective stress transfer mechanism may be deteriorated, while, additionally, the residual 132 may provide respective etch non-uniformities in the subsequent patterning sequence for forming respective contact openings. Similarly, the void 132A in the second device region 120B may also result in a reduced stress transfer mechanism, as well as degraded etch uniformity during the subsequent processing. Furthermore, at the manufacturing stage shown in FIG. 1b, a corresponding resist mask 104 is provided for protecting the dielectric layer 140 during a corresponding etch process 105 for removing the exposed portion of the layer 140 in the second device region 120B.

With respect to the formation of the second dielectric layer 140, substantially the same criteria apply as previously explained with respect to the layer 130. Hence, during the deposition of the layer 140, respective process parameters may be adjusted in an appropriate manner so that a desired high intrinsic stress may be obtained. In sophisticated applications, i.e., in semiconductor devices of feature sizes of approximately 50 nm and less, the gap fill capabilities of the deposition process for forming the layer 140 may also play an important role during the etch process 105, since, in combination with the surface topography generated during the deposition of the layer 130, a substantially complete removal of the exposed portion of the layer 140 may depend on the deposition capabilities of the subsequent deposition for a given device geometry. Hence, the thickness of the layer 140 may have to be within specified limits in order to substantially completely remove the layer 140 of the second device region 120B, and not unduly affect the overall stress transfer mechanism. Thus, a respective high degree of conformality may be required for the deposition of the layer 140 in order to efficiently remove the exposed portion thereof by the process 105, which may be controlled on the basis of the etch indicator layer 131, thereby requiring a moderately uniform layer thickness for substantially completely removing the material of the layer 140 without unduly removing the material of the layer 130.

FIG. 1c schematically illustrates the device 100 at a further advanced manufacturing stage, wherein a corresponding interlayer dielectric material 150, for instance comprised of silicon dioxide, may be formed above the first and second dielectric layers 130, 140. The dielectric material 150 may be formed on the basis of well-established techniques, such as sub-atmospheric deposition processes on the basis of TEOS and the like, which may be followed by respective planarization processes, if required. Thereafter, respective contact openings 151 may be formed, which may in some cases, for instance in dense RAM regions, connect to the device layer at areas located between respective closely spaced transistors. Thus, the corresponding irregularities 132, 132A may also affect the corresponding process, thereby resulting in less reliable contacts or even total contact failures.

As a consequence, upon further device scaling, the respective limitation of deposition processes for dielectric materials of high intrinsic stress may require a significant reduction of the layer thickness to comply with increased aspect ratios encountered in advanced device geometries. However, in this case, the respective strain induced by the stressed dielectric materials may also be significantly reduced, thereby also reducing transistor performance. In other cases, a single layer of stressed material may be provided, thereby enhancing performance of one type of transistor only.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein addresses the problem of reduced efficiency of strain-inducing mechanisms in highly scaled transistor elements due to limitations of deposition processes for dielectric materials of high intrinsic stress by providing two or more individual stress-inducing layers while providing interlayer dielectric material between respective two of the stress-inducing layers. In this way, the highly stressed dielectric material may be formed on the basis of appropriate deposition techniques, such as PECVD techniques, wherein the specific device architecture may be taken into consideration to obtain the desired high degree of conformal behavior during the deposition, while the subsequently formed portion of the interlayer dielectric material may be deposited on the basis of well-established deposition techniques, exhibiting an enhanced degree of gap-filling capability, thereby reducing the resulting surface topography to a certain degree. Hence, in a subsequent highly conformal deposition process, further material of high internal stress may be deposited, thereby increasing the overall amount of stressed material that may be positioned above a respective transistor element. Moreover, the "distribution" of the highly stressed dielectric material, which may also act as an etch stop material during the manufacturing sequence for patterning contact openings, may result in enhanced controllability of the overall patterning process, since different height levels for etch stops may be introduced into the overall interlayer dielectric stack, while the opening of the individual etch stop layers, i.e., the highly-stressed dielectric layers, may also be less critical, thereby reducing the probability for patterning induced contact failures. Thus, a highly stressed dielectric material may be provided even in device areas of high circuit density with relaxed constraints in view of gap-filling capabilities, thereby rendering the present disclosure as highly advantageous for transistor elements of the 65 nm technology and less.

One illustrative method disclosed herein comprises forming a first stress-inducing layer above a first transistor that is formed above a substrate, wherein the first stress-inducing layer generates a first type of strain in a channel region of the first transistor. The method further comprises forming a first interlayer dielectric material above the first stress-inducing layer and forming a second stress-inducing layer above the first transistor, wherein the second stress-inducing layer generates the first type of strain in the channel region of the transistor. Furthermore, a second interlayer dielectric material is formed above the second stress-inducing layer and, additionally, a contact opening is formed in the first and second interlayer dielectric materials using the first and second stress-inducing layers as an etch stop.

Another illustrative method disclosed herein comprises forming two or more first stress-inducing layers above a first transistor, wherein the two or more first stress-inducing layers generate a first type of strain in a channel region of the first transistor. The method additionally comprises forming an interlayer dielectric material between respective two of the two or more first stress-inducing layers. Moreover, the method comprises forming a contact opening connecting to the first transistor, wherein the contact opening extends through the interlayer dielectric material and the two or more first stress-inducing layers.

One illustrative semiconductor device disclosed herein comprises a first stress-inducing layer positioned above a first transistor and generating a first type of strain in a channel region of the first transistor. Furthermore, a first interlayer dielectric material is formed above the first stress-inducing layer and a second stress-inducing layer is formed above the first interlayer dielectric material and generates the first type of strain in the channel region. Additionally, the semiconductor device comprises a second interlayer dielectric material formed above the second stress-inducing layer and a contact element extending through the first and second interlayer dielectric materials and the first and second stress-inducing layers, wherein the contact element connects to a contact region of the first transistor.

BRIEF DESCRIPTION OF THE DRAWINGS

The disclosure may be understood by reference to the following description taken in conjunction with the accompanying drawings, in which like reference numerals identify like elements, and in which.

Figure 1A:
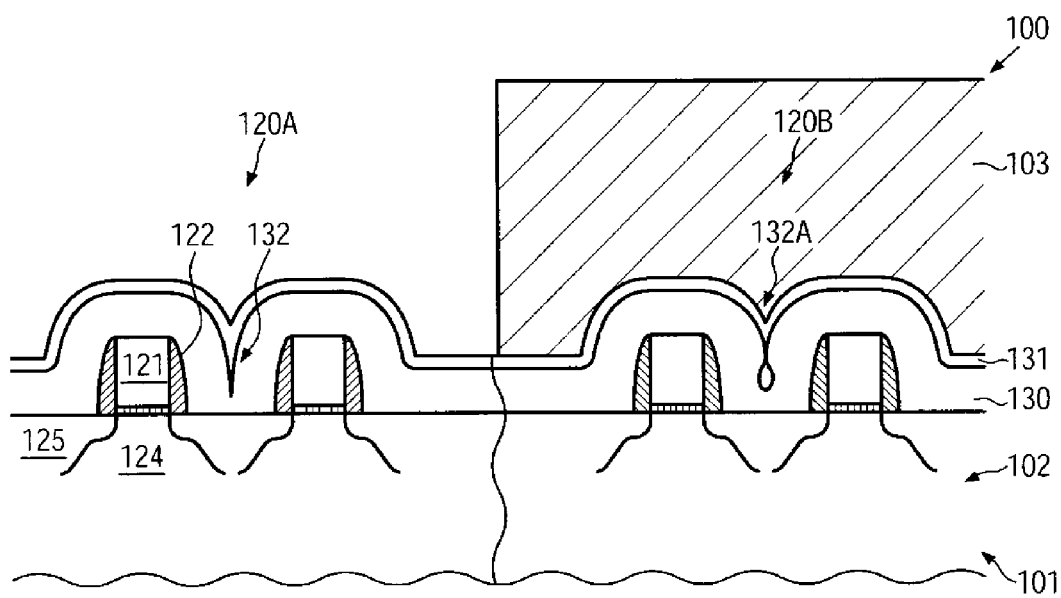
FIGS. 1a-1c schematically illustrate cross-sectional views of a semiconductor device during various manufacturing stages in forming differently stressed contact etch stop layers according to conventional techniques, wherein the semiconductor device includes densely spaced transistor elements.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the subject matter disclosed herein relates to an enhanced process technique and a respective semiconductor device in which stress-inducing layers may be formed above a device region including densely spaced transistor elements by "vertically distributing" the highly stressed material, while intermittently performing a deposition process providing interlayer dielectric material with enhanced gap-filling capability, thereby reducing the effective surface topography for a subsequent further deposition of a highly stressed material. Consequently, the techniques and devices disclosed herein provide the possibility of depositing dielectric material on the basis of process parameters that comply with the surface topography caused by extremely scaled transistor elements, for instance, when densely spaced device regions are considered, while substantially reducing any negative impact of defects and increased process non-uniformities that may be encountered in conventional approaches for forming stressed contact etch stop layers. Due to the principles disclosed herein, a dielectric material of high internal stress may be deposited in the form of a first layer on the basis of process parameters that are selected such that undesired voids or other surface irregularities may be substantially avoided or the generation thereof may be greatly reduced. Thus, the gap-filling capability of a deposition recipe under consideration may be adapted to the device geometry, while the resulting surface topography of the deposition of the first stress-inducing layer may relax deposition-related constraints by a subsequent deposition process of enhanced gap-filling capabilities in order to provide a portion of the interlayer dielectric materials, for instance, on the basis of well-established material, such as TEOS, silicon-dioxide. On the basis of the less pronounced surface topography, a further stress-inducing material may be deposited while also respecting the gap-filling capability of the deposition technique under consideration, such as a PECVD technique, thereby significantly reducing the probability of creating any defects, while nevertheless providing an increased amount of highly stressed materials above the transistor element compared to conventional dual stress line approaches. Thereafter, a further layer of interlayer dielectric material may be deposited, which may represent the last material layer of the entire contact layer stack, thereby providing a high degree of compatibility with respect to further planarization techniques prior to performing a respective lithography process for defining contact openings in the contact layer stack. Since the dielectric material having the high internal stress level may typically be provided with a different material composition and may therefore provide very different etch rates with respect to a plurality of anisotropic etch recipes, the controllability of patterning a contact opening in the dielectric layer stack may be enhanced, since the various stress-inducing material layers may now act as etch stop layers that may be provided at different height levels with a moderate layer thickness, thereby providing enhanced uniformity during etching through the respective interlayer material portions as well as during the etching of the highly stressed etch stop layers.

In some illustrative aspects disclosed herein, the above-described principles may be advantageously applied to semiconductor devices requiring stressed dielectric materials for generating different types of strain, as is, for instance, explained with reference to the device 100 (FIGS. 1a-1c) which may result in an increased gain of the total performance of CMOS devices, thereby achieving a high degree of scalability of the enhanced dual stress line approach described above.

Figure 2A:
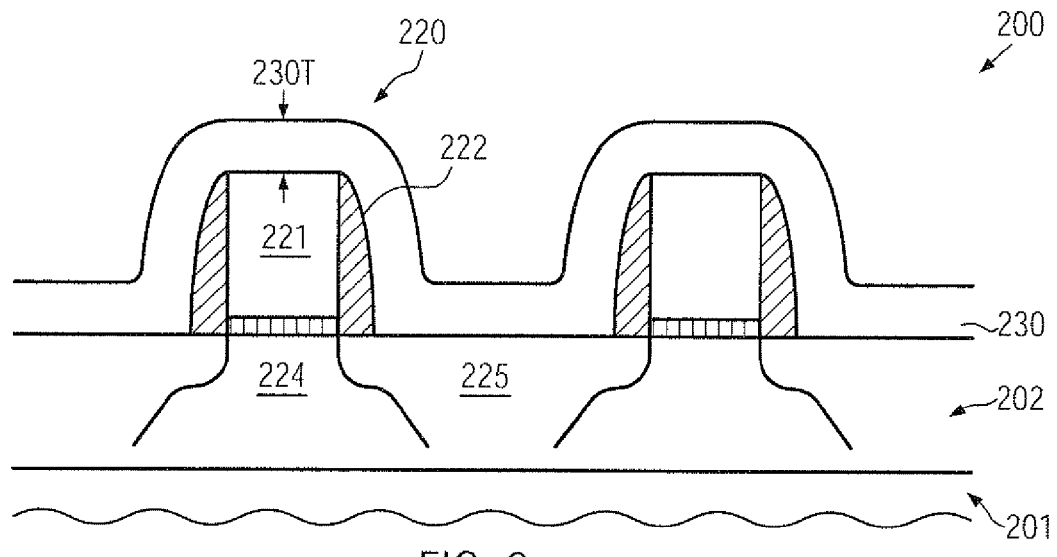
FIGS. 2a-2h schematically illustrate cross-sectional views of a semiconductor device including one or more transistor elements, above which a plurality of stressed dielectric materials, such as contact etch stop layers, are formed with intermediate dielectric material, according to illustrative embodiments.

FIG. 2a schematically illustrates a cross-sectional view of a semiconductor device 200, which may comprise a substrate 201 that may represent any appropriate carrier material, such as a semiconductor bulk substrate, for instance based on silicon, or an insulating material having formed thereon a substantially crystalline semiconductor layer 202, thereby forming a respective SOI configuration. It should be appreciated that the semiconductor device 200 may comprise other device regions, in which a different transistor architecture may be used, that is, a bulk configuration or an SOI configuration so that both transistor architectures may be concurrently realized above the substrate 201. In the embodiment shown, the semiconductor device 200 may comprise one or more first transistor elements 220 including a gate electrode structure 221 that may comprise, depending on the device and process strategy, sidewall spacers 222. Furthermore, the one or more first transistors 220 may comprise a channel region 224 that is laterally enclosed by respective drain and source regions 225. In some cases, in the drain and source regions 225 and/or in the channel region 224, appropriate materials may be incorporated, thereby further enhancing the overall charge carrier mobility in the region 224. For convenience, any such materials, such as embedded silicon/germanium alloys, silicon/carbon alloys, silicon/tin alloys and the like are not shown. Similarly, the material of the channel region 224 may be provided in a "pre-strained" state due to a stress memorization technique performed in an earlier manufacturing stage. That is, in a previous manufacturing stage, the drain and source regions 225 and/or the channel region 224, or at least portions thereof, may have been amorphized and may have been re-crystallized on the basis of a stressed or rigid material, thereby creating a specific strain in the channel region 224, which may even be maintained, at least to a certain degree, after removing the respective rigid material completely or partially, depending on the process and device requirements. Furthermore, the gate electrode 221 may comprise a metal-containing material, such as a metal silicide, or any other appropriate metal materials, in order to enhance the electrical characteristics of the gate electrode 221. The gate electrode 221 may have a length, i.e., in FIG. 2a, the horizontal extension of the gate electrode structure 221 without the spacers 222, if provided, which may range from approximately 50 nm to several tens of nanometers, depending on the technology standard under consideration. Similarly, the spacing between adjacent transistors 220 may be in the range of several tens of nanometers, thereby defining a specific surface topography and thus an aspect ratio for a deposition technique required to provide a highly stressed dielectric material above the one or more transistors 220.

Further, in this manufacturing stage, a stress-inducing layer 230 exhibiting a desired high intrinsic stress may be formed above the one or more transistors 220, wherein the intrinsic stress of the layer 230 is selected such that performance of the one or more transistors 220 is increased. For example, the transistor 220 may represent a P-channel transistor formed on the basis of a typical crystalline configuration of the semiconductor layer 202, i.e., the semiconductor layer 202 may have a (100) surface orientation with the channel region 224 being orientated with its length direction in an <110> crystal direction. In this case, a high degree of compressive stress of the layer 230 may generate a desired compressive strain in the channel region 224, thereby increasing the mobility of holes, which directly translates into increased drive current capability and thus switching speed of the one or more transistors 220. The stress-inducing layer 230 may be comprised of silicon nitride, silicon carbide, nitrogen-containing silicon carbide, with an internal stress level of two or more GPa, as previously explained. Furthermore, a thickness of the layer 230, indicated as 230T, may be adjusted to be compatible with the gap-filling capabilities of the corresponding deposition process, that is, a high degree of conformality while substantially avoiding the creation of any irregularities, such as voids and the like, as previously explained. For example, the thickness 230T may be 100 nm and less, and may be approximately 50 nm and less for transistors corresponding to the 65 nm technology node.

Figure 1B:
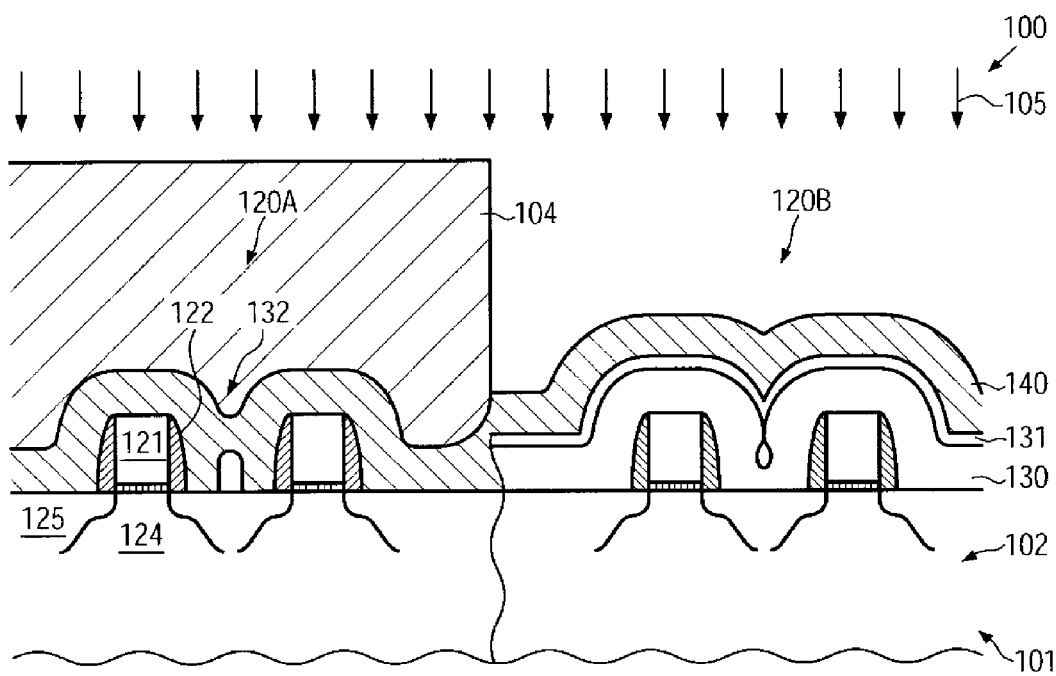
Figure 1C:
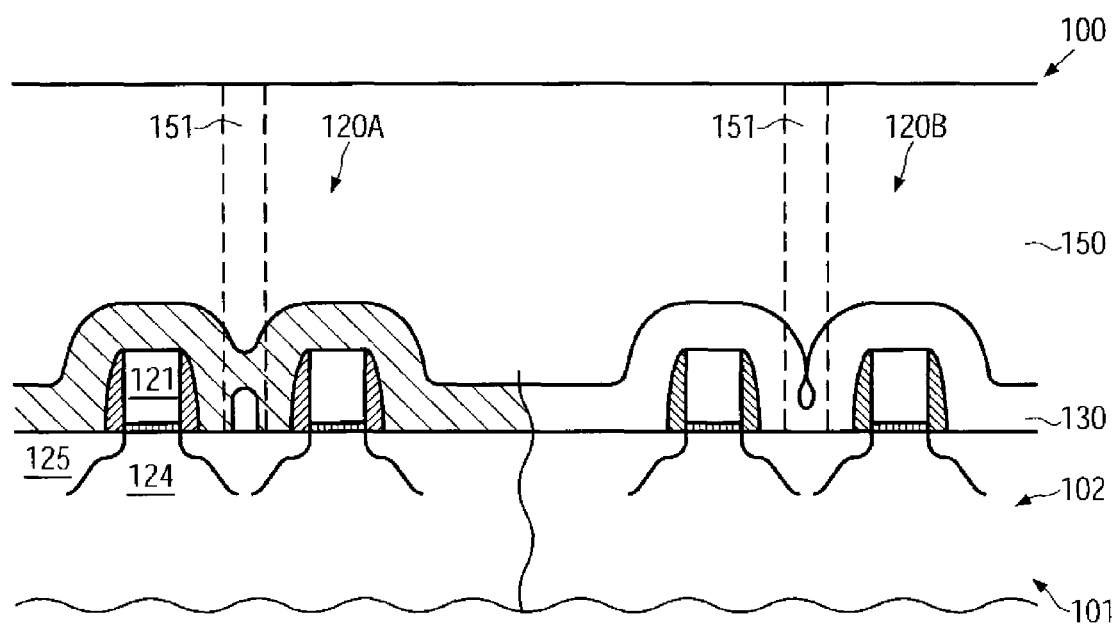

The semiconductor device 200 as shown in FIG. 2a may be formed on the basis of the following processes. The one or more transistors 220 may be formed on the basis of substantially the same process techniques as previously described for the transistors in the first or the second device regions 120A, 120B (FIGS. 1a-1c). After the completion of the basic transistor structures, the stress-inducing layer 230 may be deposited, for instance, on the basis of a PECVD technique, wherein the process parameters are appropriately selected such that the desired type and magnitude of the internal stress is achieved, as previously explained. Furthermore, the target thickness is selected such that the thickness 230T may result in a substantially conformal deposition essentially without causing any surface irregularities or voids. In some illustrative embodiments, the stress-inducing layer 230 may be directly formed on the one or more transistors 220, that is, the material of the layer 230 may directly contact the drain and source regions 225, for instance, any metal silicide regions formed therein, and may also directly contact the gate electrode 221. In other cases, a thin buffer layer (not shown) may be formed prior to the deposition of the stress-inducing layer 230, wherein the buffer layer may act as a protection layer when forming the stress-inducing layer 230, such as the removal of any material that may have been formed above the transistors 220 prior to depositing the layer 230. In other cases, the buffer layer may be provided on the basis of a deposition technique which may allow reduction of the surface typography to a certain degree so as to further relax the constraints for the conformal deposition technique for forming the highly stressed layer 230.

Figure 2B:
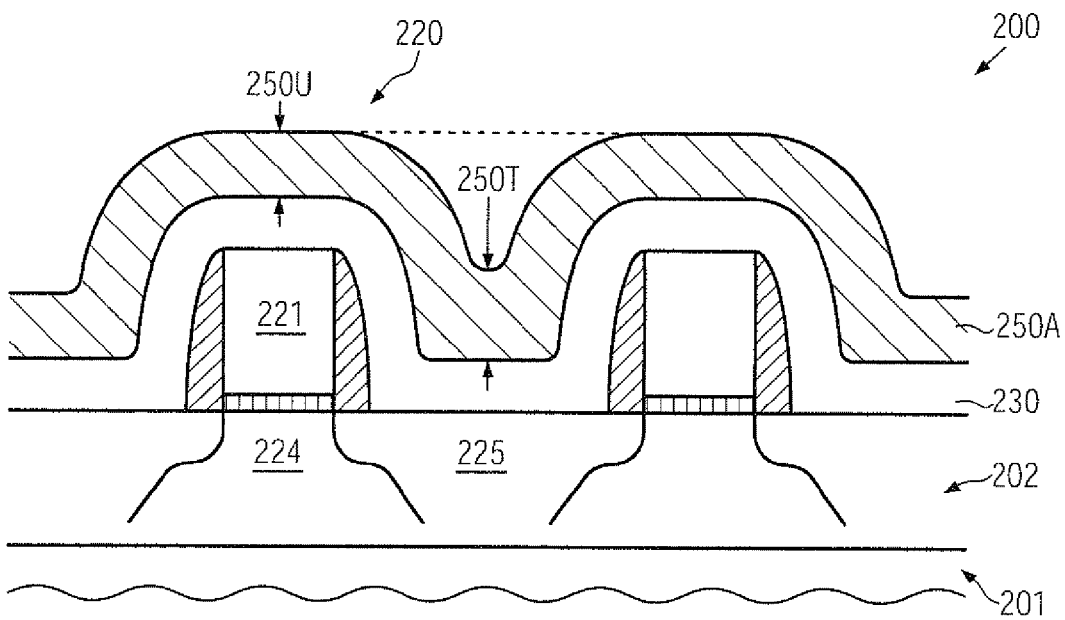

FIG. 2*b* schematically illustrates the semiconductor device 200 in a further advanced manufacturing stage, in which an interlayer dielectric material, that is a first layer 250A is formed above the stress-inducing layer 230. The material 250A may be comprised of any appropriate material composition that provides enhanced gap-filling capabilities and is compatible with the requirements for an interlayer dielectric material of a contact layer stack. That is, the material of the layer 250A represents a dielectric material having a desired degree of mechanical and chemical stability in order to insure the integrity of the transistors 220 during the further processing and operation of the semiconductor device 200. In one illustrative embodiment, the material 250A may represent a silicon dioxide material having an average thickness that is selected to reduce the surface topography defined by the stress-inducing layer 230. For this purpose, the interlayer dielectric material 250A may be provided such that a thickness 250U, for instance, taken above the gate electrode 221, is less than a thickness 250T taken in the middle of the distance between the two neighboring transistors 220. Thus, a certain degree of "leveling" may be obtained by the layer 250A, thereby relaxing any constraints for a subsequent deposition technique having a limited gap-filling capability but enabling the deposition of a highly stressed material, such as PECVD techniques for forming silicon nitride, silicon carbide and the like. An average thickness of the layer 250A, which may be considered a mean value obtained from the values 250U, 250T, may be higher compared to the thickness 230T (FIG. 2*a*) of the layer 230.

The layer 250A may be formed on the basis of a deposition technique having enhanced gap-filling capabilities, wherein, for instance, a silicon dioxide material may be formed on the basis of a thermal chemical vapor deposition (CVD) process using TEOS as a precursor material, thereby providing a deposition process having excellent gap-filling capabilities. In this case, a reduced degree of conformality, for instance, a substantially "flow-like" fill behavior, may be achieved, depending on the process parameters selected. The respective thermal deposition process may be performed at significantly higher pressures compared to a plasma-enhanced deposition technique, for instance, in the range of 200-700 Torr, and therefore the process is frequently noted as "sub-atmospheric" chemical vapor deposition (SACVD). In other cases, a high density plasma may be created in a PECVD process performed on the basis of TEOS, thereby also obtaining a silicon dioxide material having enhanced gap-filling capabilities.

Figure 2C:
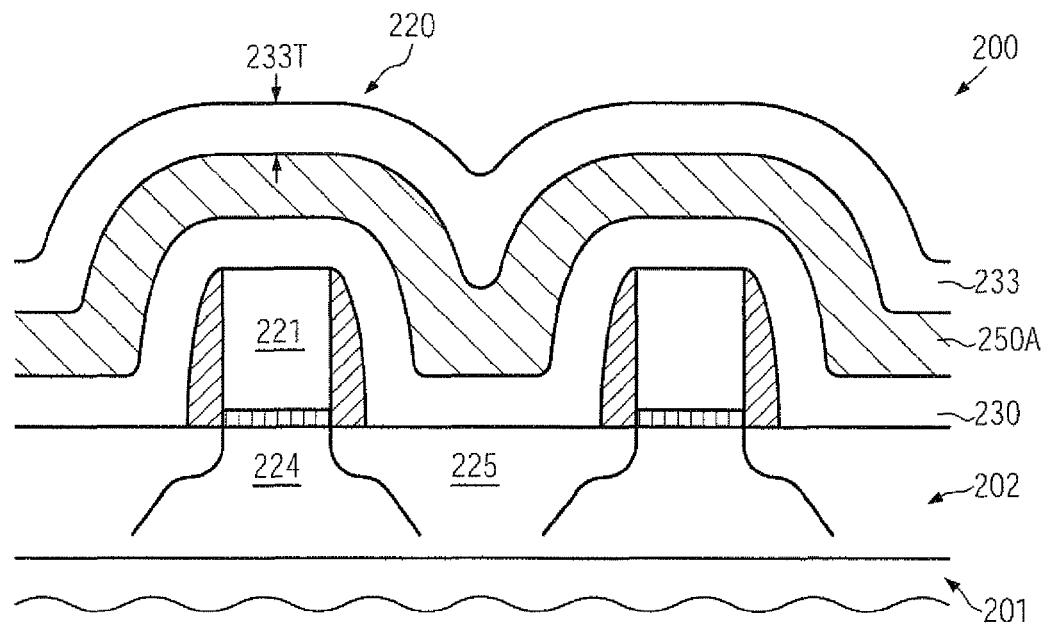

FIG. 2*c* schematically illustrates the semiconductor device 200 in a further advanced manufacturing stage. As shown, the semiconductor device 200 may comprise a further stress-inducing layer 233, which may have a high internal stress level in order to further enhance the strain in the channel region 224. For example, the layers 230, 233 may each comprise a high internal compressive stress level, thereby enhancing the performance of the transistors 220, when representing a P-channel transistor formed in accordance with a standard crystallographic configuration of the semiconductor layer 202. The stress-inducing layer 233, which may be comprised of silicon nitride, silicon carbide and the like, may be formed on the basis of process parameters so as to substantially avoid the creation of any defects, such as voids, seams and the like, wherein the previously formed layer 250A provides similar or even enhanced surface conditions compared to the initial surface topography encountered during the deposition of the layer 230. That is, the layer 233 may be formed on the basis of process parameters that provide the desired high internal stress level, while a deposition time is appropriately selected to obtain a thickness 233T that is compatible with the surface topography defined by the layer 250A. For example, the thickness 233T may be similar to the thickness 230T (FIG. 2*a*), or may be higher, when depositing the layer 250A results in a reduced aspect ratio of recesses created by the spaces between neighboring transistors, such as the transistors 220. For example, a thickness of 100 nm and less may be selected, depending on the device configuration, wherein it should be appreciated that the combined thickness of the layers 230, 233 may be greater compared to the thickness of a conventional device, for instance, the device 100 including the stress layers 130 or 140. Consequently, the amount of stressed material that may be positioned above the transistors 220 may be increased, while nevertheless respecting the gap-filling capabilities of the PECVD technique in order to significantly reduce or substantially avoid the creation of defects in the form of voids or seams.

Consequently, considering, for instance, a highly compressive stress in the layers 230, 233, the layer 233 may act on the material of the layer 250A, thereby also compressing the layer 250A, which enhances the effect of the layer 230, thereby finally resulting in an increased strain in the channel region 224.

Figure 2D:
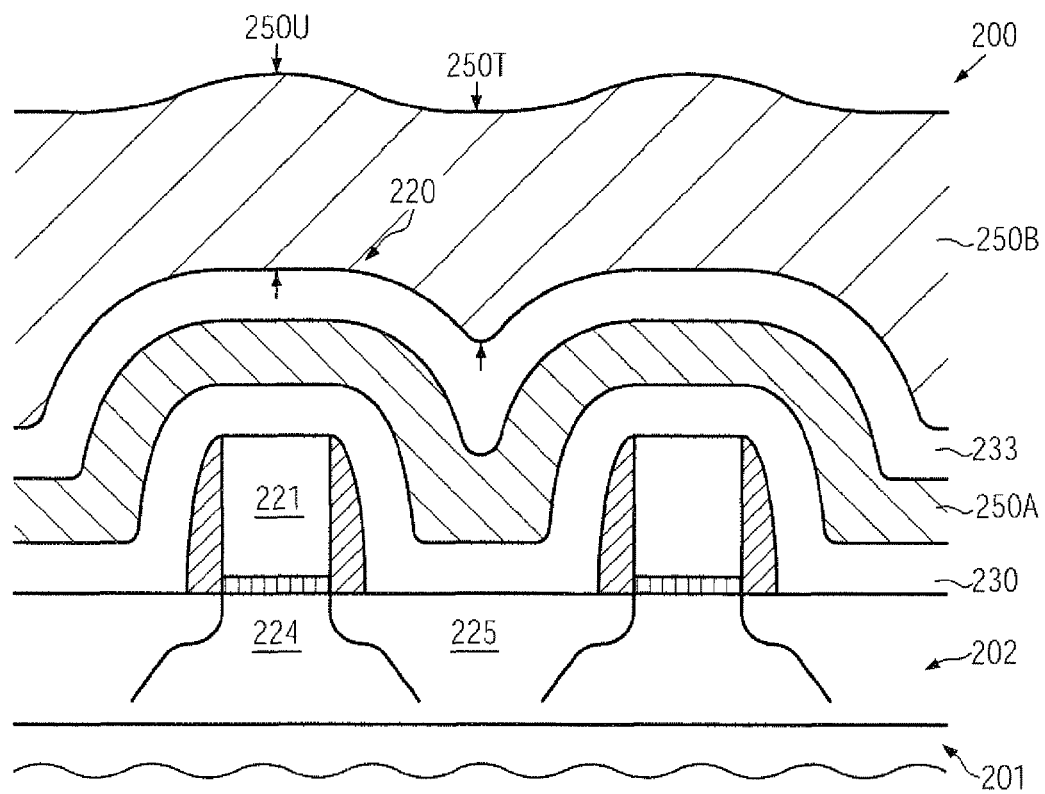

FIG. 2*d* schematically illustrates the semiconductor device 200 with a further interlayer dielectric material 250B formed above the stress-inducing layer 233. The interlayer dielectric material 250B may be comprised of any appropriate material composition, such as silicon dioxide formed on the basis of TEOS, as is frequently used as an interlayer dielectric material. Thus, if the layer 250B is the last material layer of the complete dielectric layer stack formed above the transistors 220, a high degree of compatibility with conventional process strategies may be obtained. Furthermore, the layer 250B may be provided with an average thickness, for instance, defined by the thickness values 250U, 250T, which is greater than each of the thickness values 233T (FIG. 2*c*), 230T (FIG. 2*a*), and which may also be greater than the average thickness of the layer 250A. For instance, depending on the device requirements, the layer 250B may be provided with an average thickness of several hundred nm or more. As previously explained with reference to the material 250A, the layer 250B may also be formed on the basis of an SACVD technique in order to obtain the desired material characteristics and deposition behavior with respect to gap-filling capabilities and throughput.

Figure 2E:
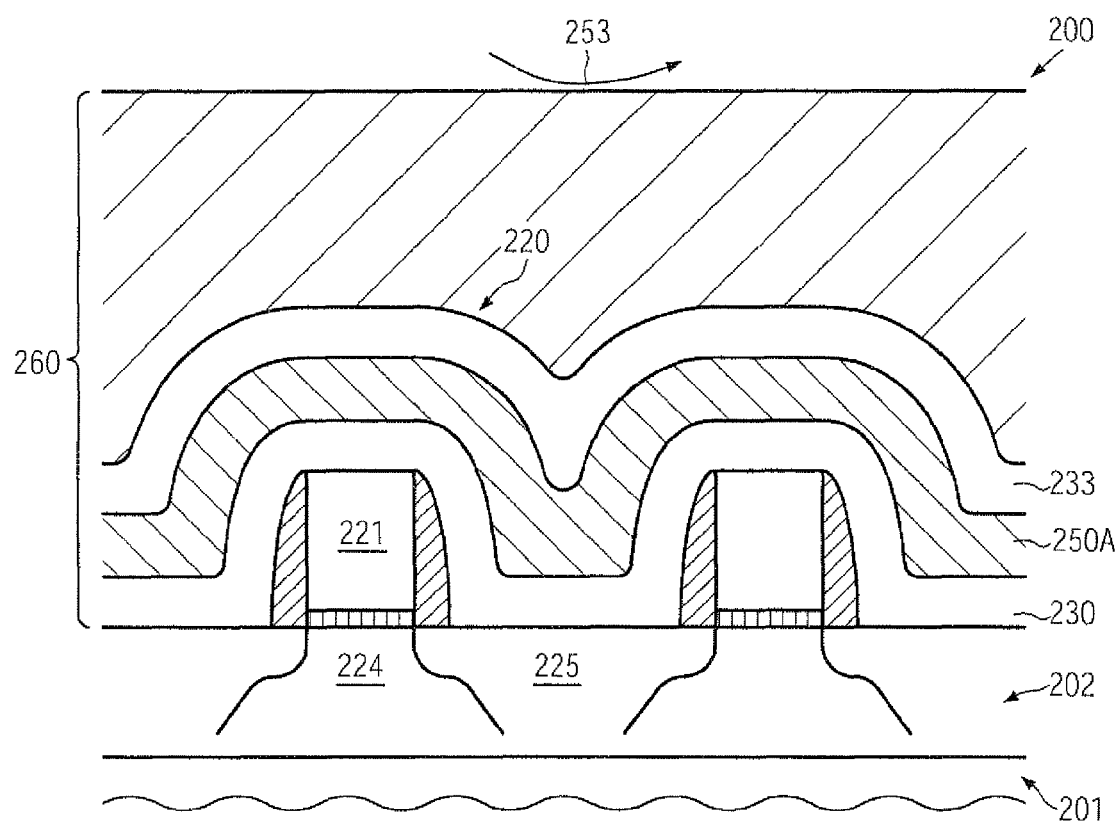

FIG. 2*e* schematically illustrates the semiconductor device 200 during a planarization process 253, which may comprise a chemical mechanical polishing (CMP) process, an etch process, possibly in combination with the deposition of a further planarization material, and the like. During the process 253, the final surface topography may be planarized in order to prepare the interlayer dielectric stack 260 for a patterning process to form a contact opening through the stack 260 to establish a connection to a contact area of one or more of the transistors 220, such as the drain and source region 225. In some illustrative embodiments, the planarization process 253 may be performed on the basis of well-established recipes, since the last layer of the stack 260, i.e., the interlayer dielectric material 250B (FIG. 2d), may be provided as a conventional interlayer dielectric material.

Figure 2F:
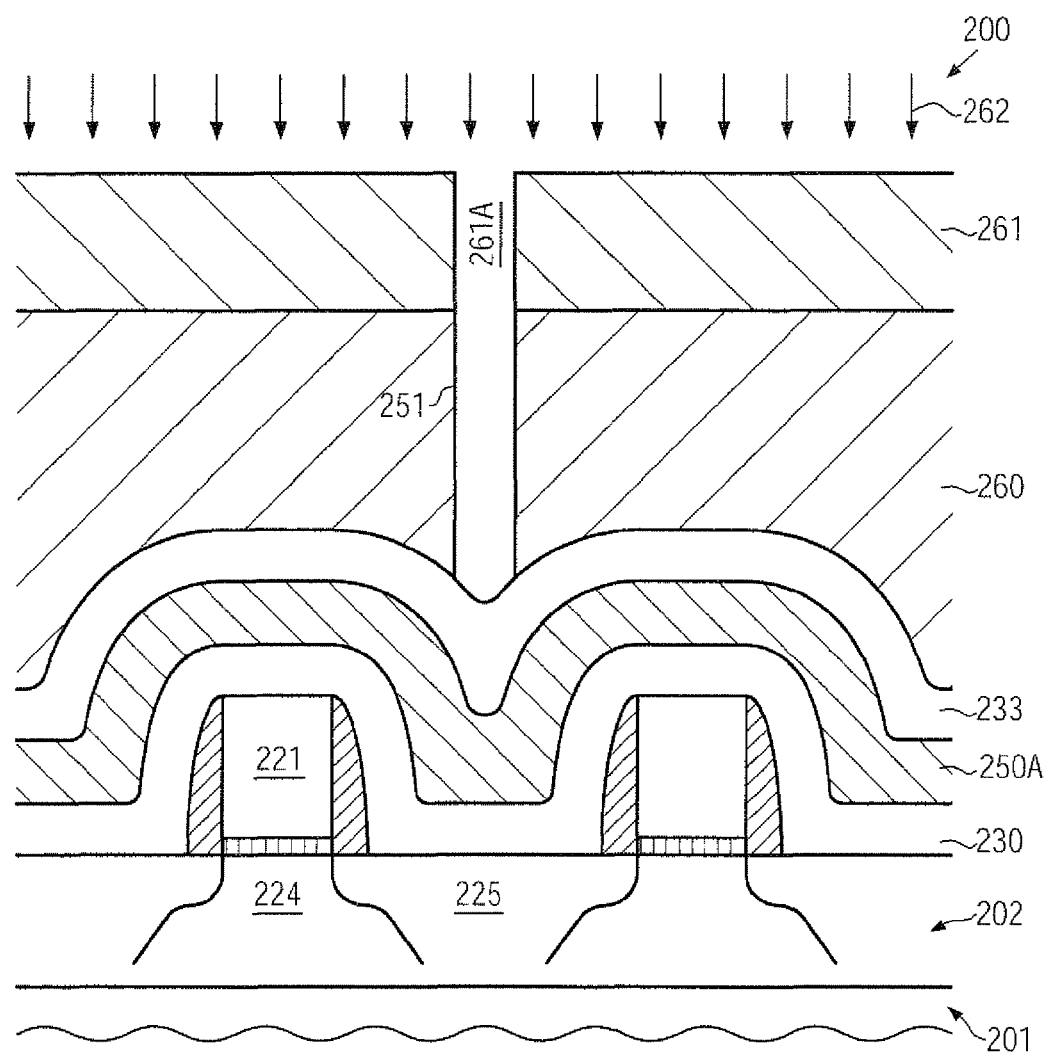

FIG. 2f schematically illustrates the semiconductor device 200 with an etch mask 261 having formed therein an opening 261A in order to define the lateral position and size of a contact opening 251 in the stack 260. The etch mask 261 may be formed on the basis of well-established lithography techniques, since the surface characteristics of the layer stack 260 may be compatible with well-established recipes, since the same material may be provided for the last layer 250B, as previously explained. During an etch process 262, a first portion of the contact opening 251 may be formed in the interlayer dielectric material 250B based on the opening 261A, wherein, in one illustrative embodiment, the etch process 262 may represent a selective etch recipe so as to allow the stress-inducing layer 233 to act as an etch stop material. Consequently, during the etch process 262, the opening 251 is formed to extend to a first height level defined by the layer 233 that acts as an etch stop layer.

Figure 2G:
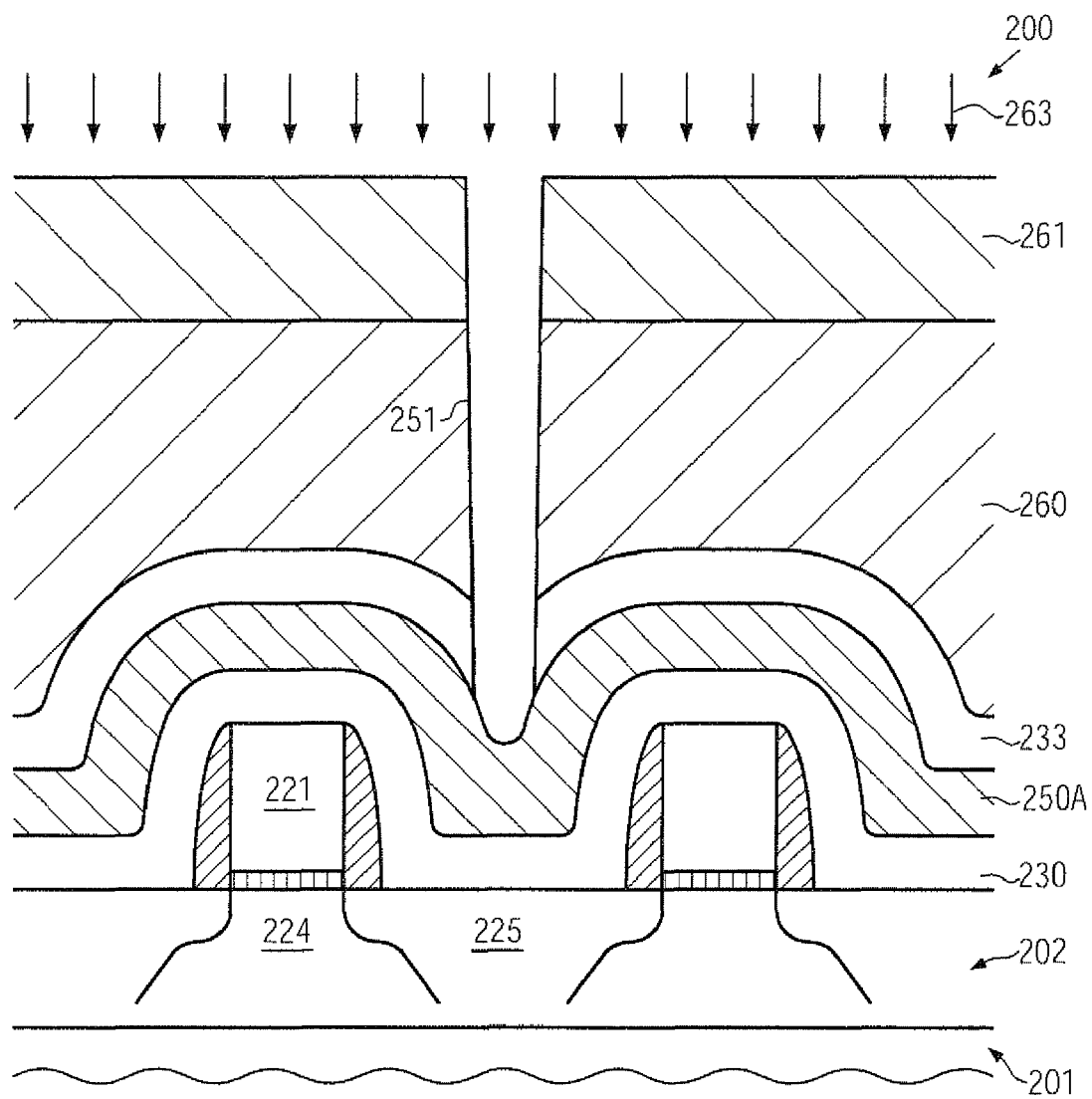

FIG. 2g schematically illustrates the semiconductor device 200 during a further etch step 263, which is designed to etch through the layer 233, wherein well-established etch recipes may be used when silicon dioxide is used for the layer 250B and a silicon nitride or silicon carbide-based material is used for the layer 233. In this case, the layer 250A acts as an etch stop material, thereby providing enhanced across-substrate uniformity during the etch process 263. Thereafter, the etch recipe may be changed again, for instance, by using process parameters corresponding to the etch process 262, when the material layers 250A, 250B are substantially comprised of the same material composition. During this further etch process, the layer 230 may act as an etch stop material, which may then be opened on the basis of a further etch process, for instance, based on a recipe corresponding to the etch process 263 so as to connect to a contact region of the transistor elements 220. Consequently, each etch step may be controlled on the basis of a respective etch stop layer, i.e., the layers 233, 230, and hence a high degree of process uniformity may be obtained, while also any process irregularities which may occur in conventional strategies when opening a moderately thick etch stop material between closely spaced transistors may be substantially avoided.

Figure 2H:
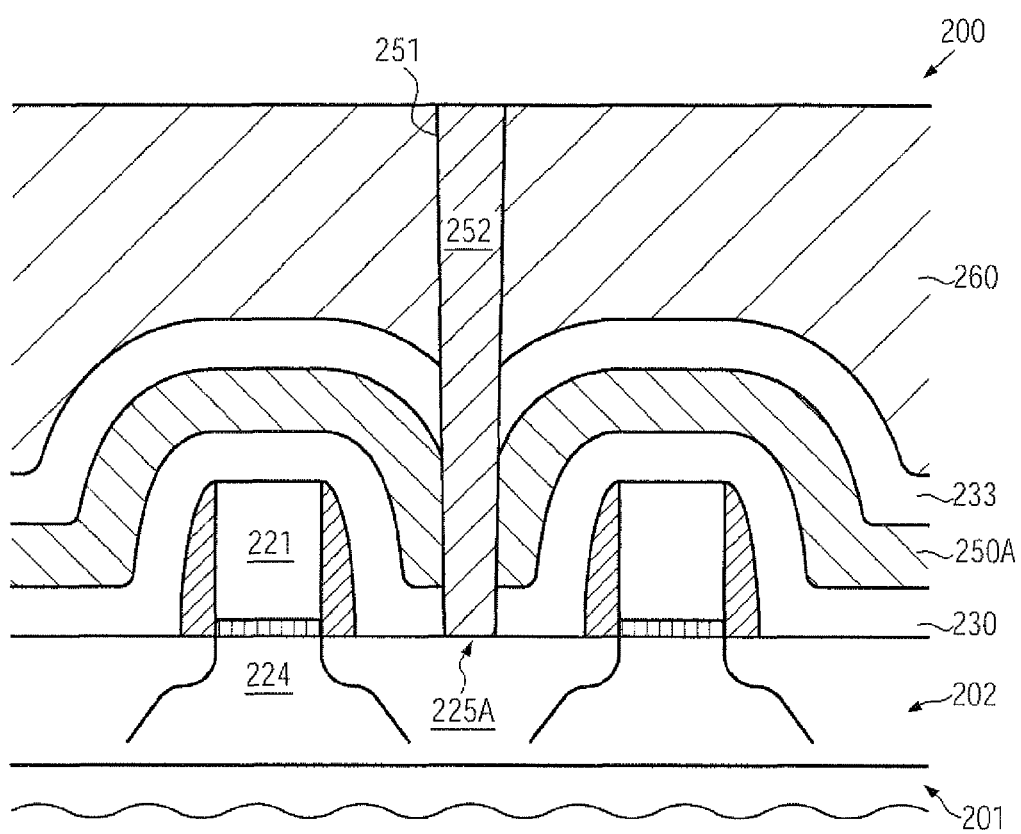
Figure 2I:
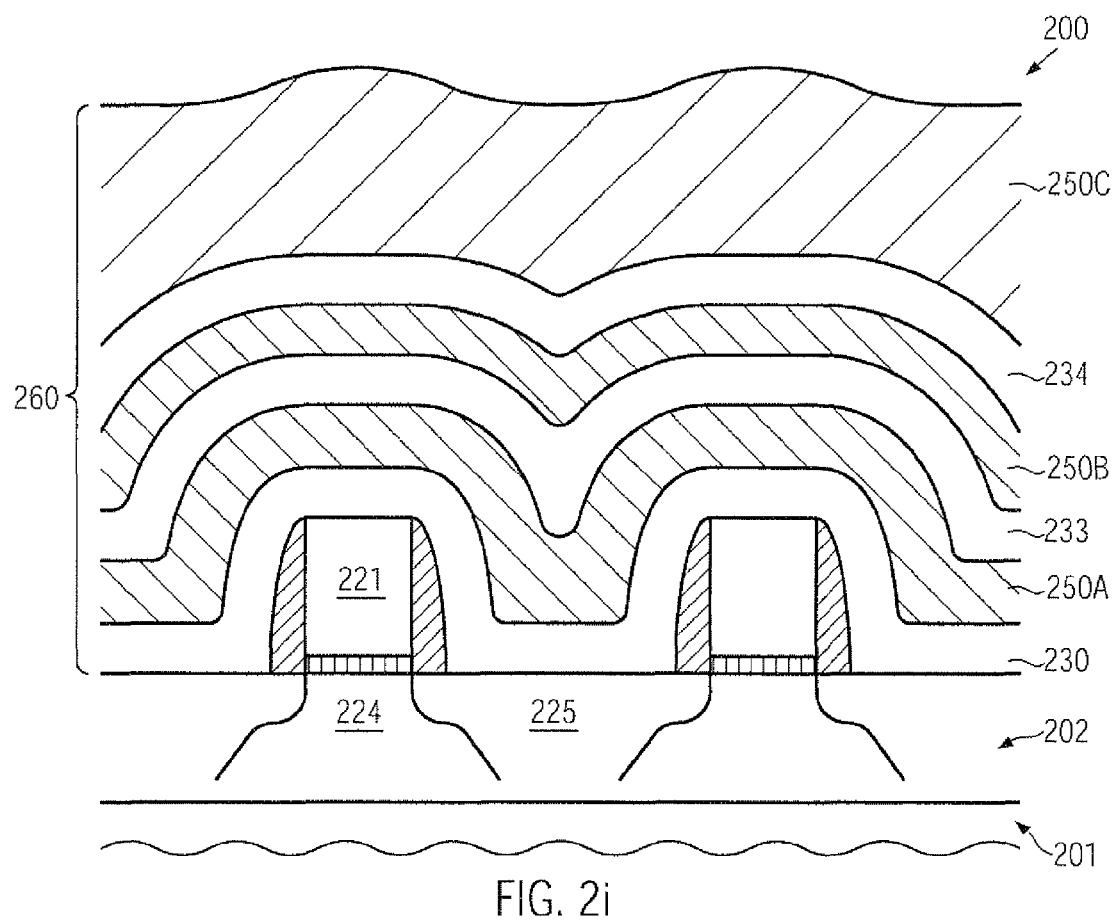
FIG. 2i schematically illustrates a cross-sectional view of a semiconductor device including a plurality of stress-inducing layers separated by an interlayer dielectric material formed on the basis of a deposition technique having a high gap-filling capability, according to still further illustrative embodiments.

FIG. 2h schematically illustrates the semiconductor device 200, in which the contact opening 251 now extends to a contact region 225A, which may be subsequently filled with any appropriate conductive material, such as tungsten, copper, aluminum and the like, depending on the device requirements, to define a contact element 252. FIG. 2i schematically illustrates the semiconductor device 200 according to further illustrative embodiments. As shown, the dielectric contact layer stack 260 may comprise a plurality of stress-inducing layers 230, 233, 234, each of which may have a high internal stress level to induce the desired type of strain in the channel region 224, as previously explained. For example, the layers 230, 233, 234 may represent stress-inducing layers exhibiting a high compressive stress of 2 or more GPa. In other cases, the layers 230, 233, 234 may represent tensilely stressed dielectric materials. Between respective two of the layers 230, 233, 234, an interlayer dielectric material such as the materials 250A, 250B may be provided to reduce the surface topography prior to the deposition of a respective one of the layers 230, 233, 234, as previously explained. Moreover, a last layer 250C may be provided and may have, in some illustrative embodiments, similar material characteristics as in well-established contact layer stacks, thereby providing a high degree of compatibility with conventional process strategies.

For the deposition of the layer 234, the same criteria apply as previously explained with reference to the layers 230, 233. Similarly, the layers 250B and 250C may be formed on the basis of a deposition technique having enhanced gap-filling capabilities, as explained above. Thereafter, the further processing may be continued by planarizing the layer stack 260, for instance on the basis of the processes described above, and subsequently a patterning process may be performed in order to form the contact opening 251 (FIG. 2h). In this case, respective etch processes 262 (FIG. 2f) and 263 (FIG. 2g) may be alternately performed to pattern the respective one of the layers 250C, 250B and 250A and the layers 234, 233, and 230. In other illustrative embodiments, a first etch process may be used that has substantially no selectivity between the stress-inducing layers and the interlayer dielectric materials, wherein, after a predefined etch time, the etch chemistry may be changed to obtain a high degree of etch selectivity for material of the layers 250B, 250A or for material of the layers 233, 230, thereby enabling an efficient control of the remaining etch process. Thus, in this case, an efficient etch process may be performed down to a specified depth of the stack 260 and subsequently a high degree of controllability and uniformity may be obtained by switching to a highly selective etch recipe to continue on the basis of at least one etch stop material.

In other illustrative embodiments, an etch indicator material may be incorporated into one of the lower lying material layers, such as the layer 233 or 250A, to provide a pronounced endpoint detection signal, wherein an etch front of a moderately low selective etch process liberates the corresponding etch indicator species. In other illustrative embodiments, the etch indicator species may be incorporated after finishing the layer stack 260, thereby providing a substantially uniform height level for the etch indicator material, thereby providing a representative signal when a specified etch depth is reached. Thereafter, it may be switched to a selective etch recipe which may be continued on the basis of one or more etch stop layers, such as the layer 230, 233, when, for instance, the uniform height level is within the layers 250B and 234. Thus, although a plurality of different material layers may be provided in the stack 260, an efficient patterning regime may be obtained, while nevertheless providing a high degree of controllability. Furthermore, due to the plurality of highly stressed layers, such as the layers 230, 233, 234, an even further enhanced amount of stressed material may be positioned above the transistors 220, even for highly scaled semiconductor devices requiring a moderately thin layer thickness for each of the highly stressed materials due to the pronounced surface topography.

With reference to FIGS. 3a-3e, further illustrative embodiments will now be described, in which different device regions may receive stressed dielectric materials which may differ in magnitude and/or type of internal stress in order to enhance performance of one type of transistors while not substantially negatively affecting the other type of transistors or to individually enhance the performance of both types of transistors.

Figure 3A:
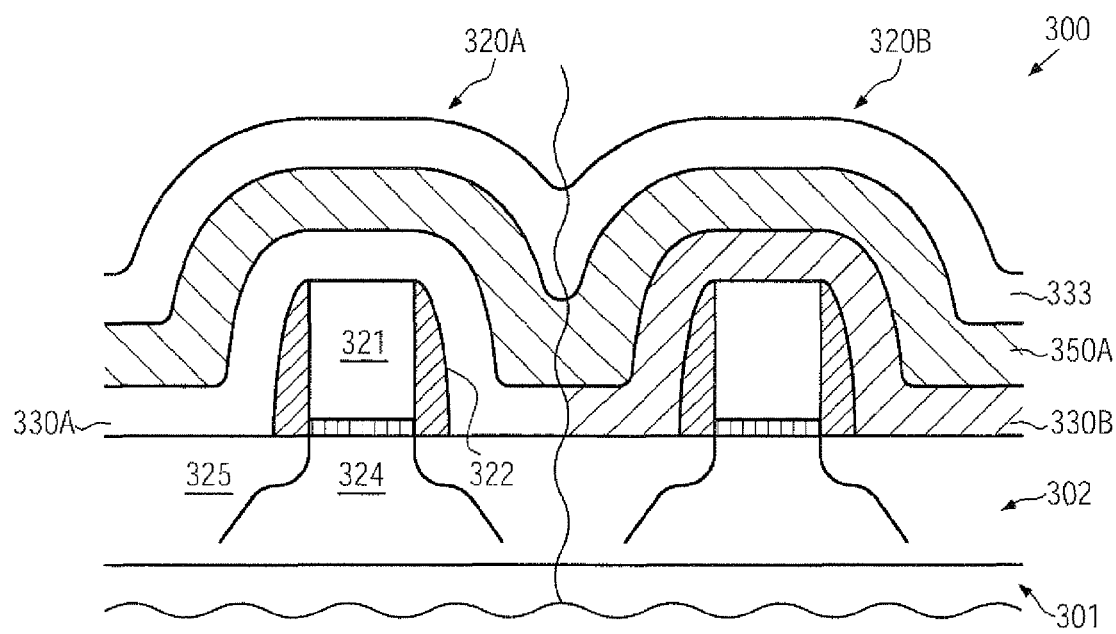
FIGS. 3a-3b schematically illustrate cross-sectional views of a semiconductor device including different types of transistor elements, above which are formed stress-inducing layers with intermediate dielectric material, wherein a negative impact of the stress-inducing layer above one type of transistor may be reduced, according to further illustrative embodiments.

FIG. 3a schematically illustrates a semiconductor device 300 comprising a substrate 301 having formed thereabove a semiconductor layer 302. Furthermore, a first transistor 320A, which may be formed above a first device region, and a second transistor 320B, which may be formed above a second device region, may represent transistors of different type, which may require a different type of strain in the channel regions 324 so as to individually enhance performance of the transistors 320A, 320B. The transistors 320A, 320B, while of different type, may comprise a gate electrode structure 321, possibly in combination with a spacer structure 322, and may have drain and source regions 325 laterally enclosing the channel region 324, as is previously explained with reference to semiconductor devices 100 and 200. It should be appreciated that the transistors 320A, 320B, although shown with the same configuration, may represent transistors of different conductivity type or transistors having a different operational behavior, thereby requiring a different magnitude or type of strain in the respective channel regions 324. For instance, the transistor 320A may represent one or more P-channel transistors, while the transistor 320B may represent one or more N-channel devices. Furthermore, with respect to the other components, i.e., the substrate 301 and the semiconductor layer 302, the same criteria apply as previously explained. The device 300 may further comprise a first stress-inducing layer 330A, configured to induce a first type of strain in the channel region 324 of the transistor 320A, while a second layer 330B, which in one illustrative embodiment may represent a stress-inducing layer generating a strain for enhancing performance of the transistor 320B, may be provided in this stage. In other cases, the layer 330B may represent a substantially stress-neutral layer. Above the layers 330A, 330B is provided a first interlayer dielectric material 350A, for instance in the form of silicon dioxide provided with an increased gap-filling capability and with an appropriate thickness, as previously explained when referring to the material 250A. Moreover, a further stress-inducing layer 333 is formed above the first and second transistors 320A, 320B, wherein, in the embodiment shown, the layer 333 may have a high internal stress so as to further enhance the strain in the channel region 324 of the first transistor 320A.

The semiconductor device 300 as shown in FIG. 3a may be formed on the basis of the following processes. After forming the transistors 320A, 320B on the basis of well-established techniques, the layers 330A, 330B may be formed by a conventional dual stress liner approach, as previously explained with reference to FIGS. 1a-1c, wherein, however, a thickness of the respective stressed materials may be selected in conformity with the gap-filling capability of the respective deposition technique, thereby reducing the probability of creating voids or seams, contrary to what is described with respect to FIGS. 1a-1c. In other illustrative embodiments, in which the layer 330B may represent a substantially stress-neutral layer, the layer 330A may be formed above both transistors 320A, 320B and subsequently an internal stress level may be reduced or relaxed by ion implantation above the second transistor 320B. Thereafter, the material 350A may be formed on the basis of process strategies previously explained, followed by the deposition of the layer 333 as explained above. In order to reduce a negative impact of the layer 333 above the second transistor 320B, an ion implantation process may be performed to significantly reduce or relax the stress level above the second transistor 320B.

Figure 3B:
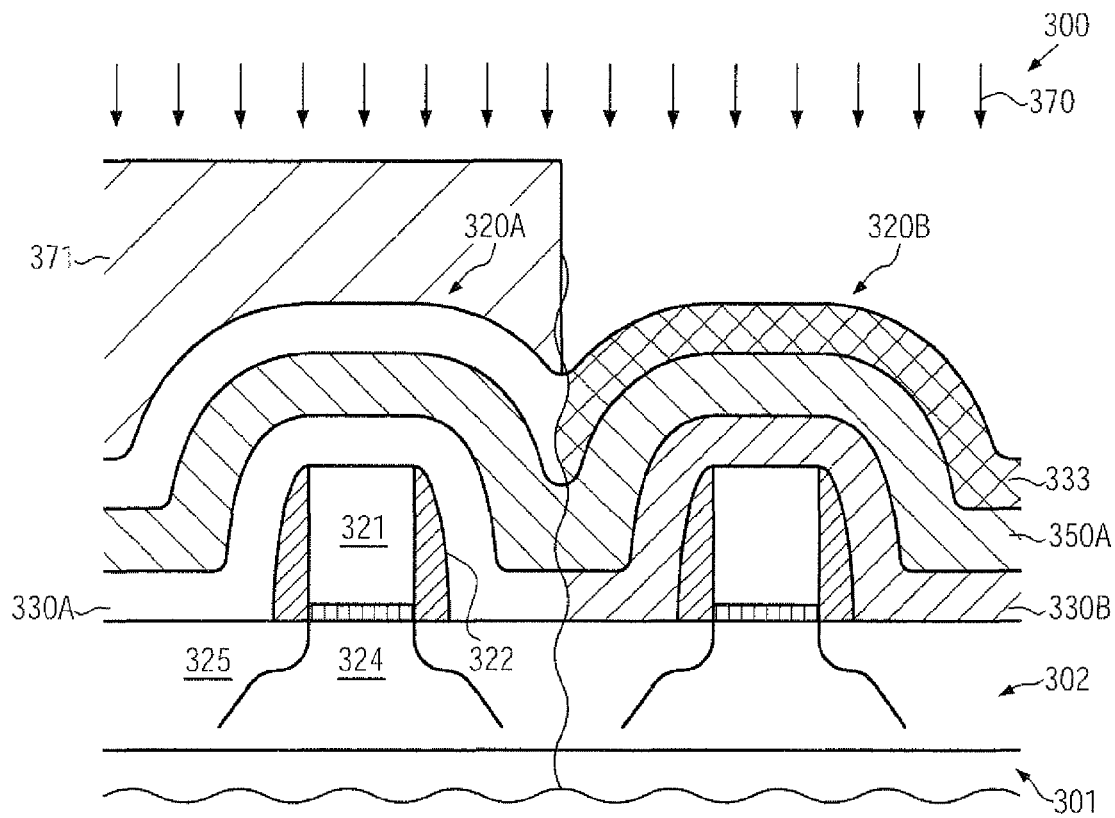

FIG. 3b schematically illustrates the device 300 during a corresponding implantation process 370 that is performed on the basis of a respective implantation mask 371 that covers the first transistor 320A while exposing the second transistor 320B. The implantation process may be performed on the basis of any appropriate species, such as xenon, using process parameters the selection of which is less critical, since the layer 350A represents a buffer material, which may substantially suppress any unwanted penetration of the layer 330B, when representing a highly stressed layer, such as a tensilely stressed material. There-after, the further processing may be continued, for instance, by the deposition of a further interlayer dielectric material as the last material of the respective contact layer stack, or by alternating the deposition of an interlayer dielectric material and a highly stressed material while respectively relaxing the highly stressed material above the second transistor 320B on the basis of an implantation process, such as the process 370.

Figure 3C:
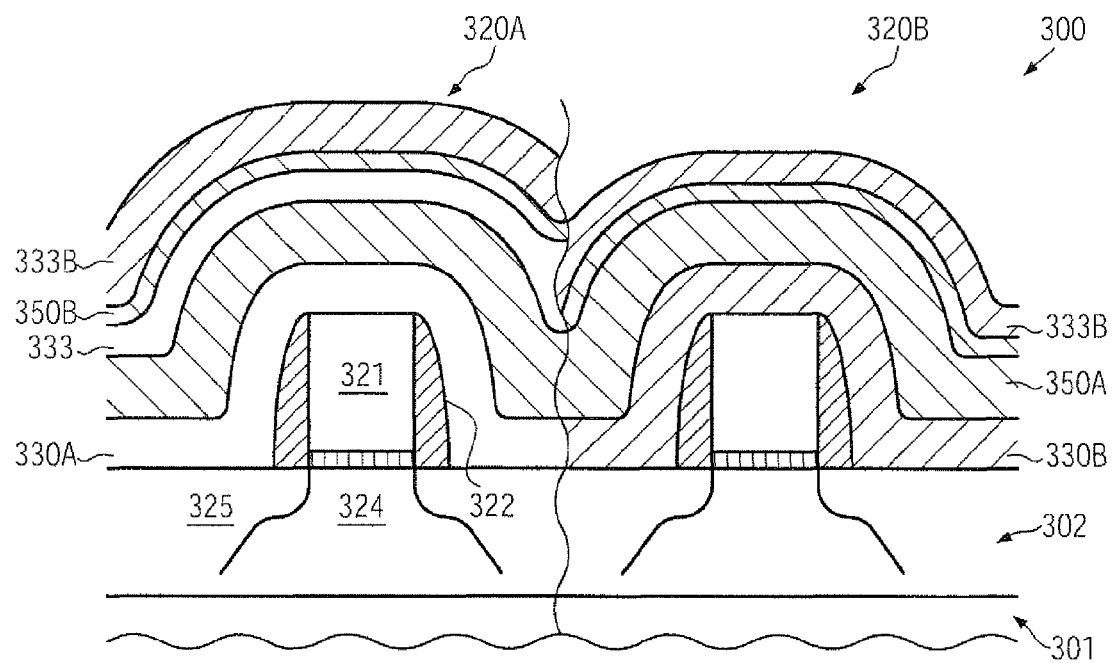
FIGS. 3c-3d schematically illustrate cross-sectional views of a semiconductor device during a manufacturing sequence for forming different stress-inducing layers with respective intermediate dielectric material above different types of transistors, according to yet other illustrative embodiments.

FIG. 3c schematically illustrates the semiconductor device 300 according to a further illustrative embodiment, in which the process 370 may represent an etch process for removing the exposed portion of the layer 333, wherein the material 350A above the second transistor 320B may have been used as an etch stop material. Thus, based on this configuration, a further buffer material such as an interlayer dielectric material may be formed followed by the deposition of a highly stressed material designed to enhance the performance of the second transistor 320B. FIG. 3c schematically illustrates the semiconductor device 300 after the above-described process sequence and thus comprises the layer 333 selectively formed above the first transistor 320A, followed by the interlayer dielectric material 350B and a highly stressed layer 333B.

Figure 3D:
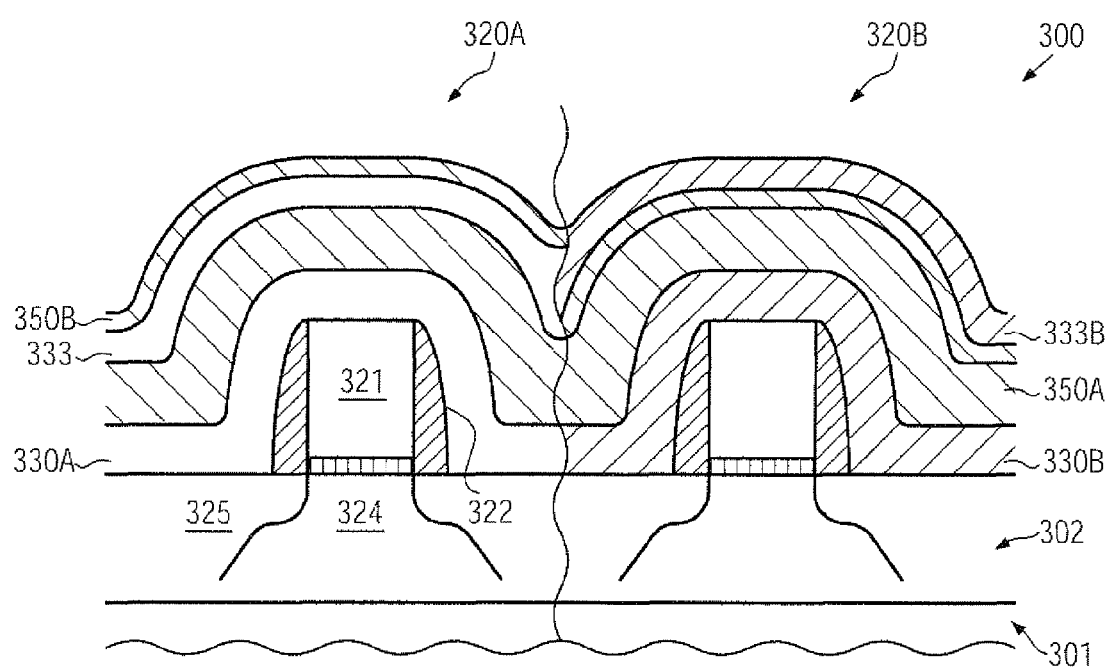

FIG. 3d schematically illustrates the semiconductor device 300 in a further advanced manufacturing stage. As shown, the stressed material 333B may be selectively removed above the first transistor 320A, which may be accomplished, for instance, by a selective etch process using the material 350B as an etch stop material. Thus, the first transistor 320A comprises the stressed layers 330A, 333, while the second transistor 320B comprises the stressed or neutral layer 330B and 333B. It should be appreciated that all the layers 330A, 330B, 333, 333B may be provided on the basis of an appropriate thickness so as to respect the gap-filling capabilities of the deposition technique, i.e., of the PECVD technique, while the material 350A and 350B provides a relaxed surface topography for the deposition of the layers 333 and 333B. Thereafter, the further processing may be continued, as previously described, for instance, by depositing the last layer of a corresponding contact layer stack or by forming a further interlayer dielectric material and depositing a further stress-inducing layer thereon followed by a further deposition of an interlayer dielectric material, as previously explained.

Figure 3E:
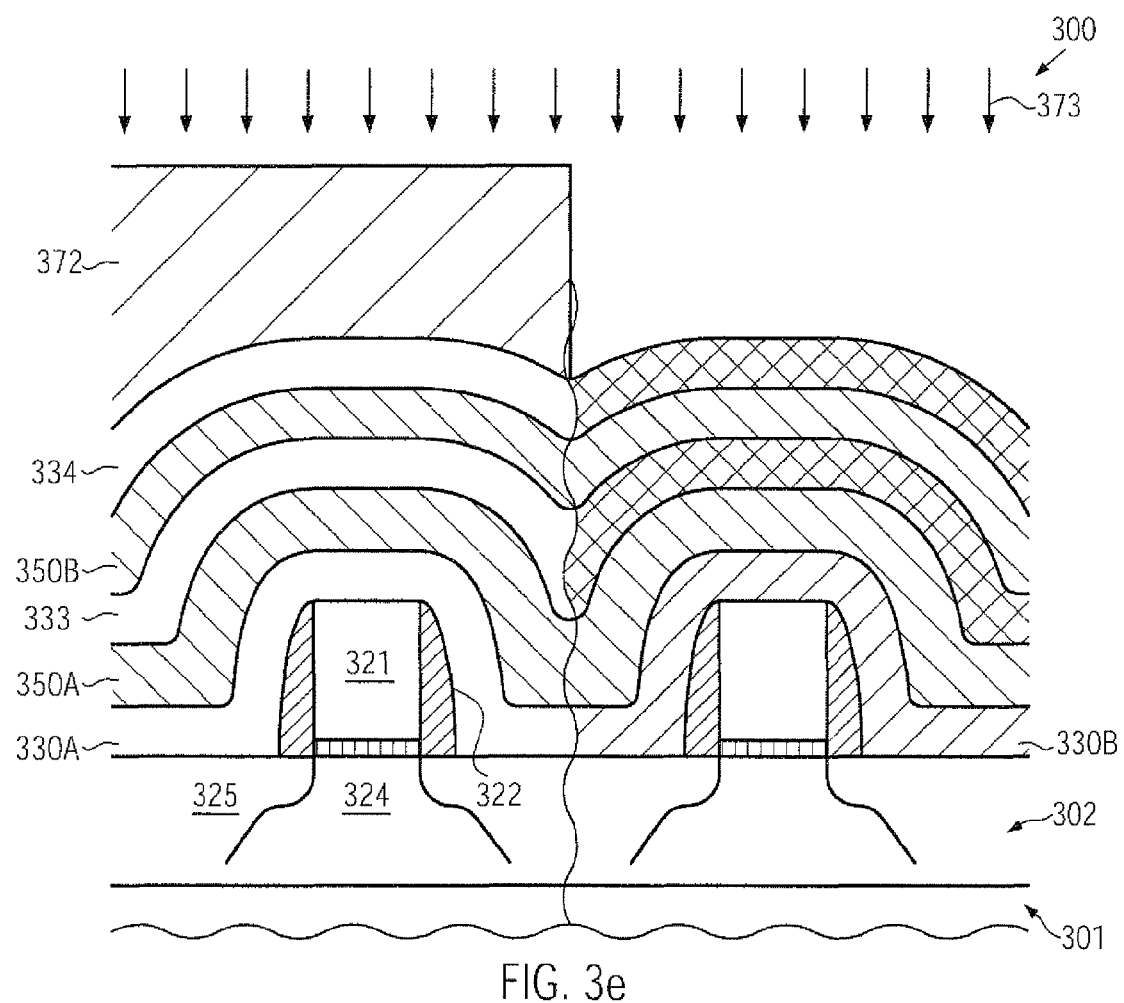
FIG. 3e schematically illustrates a semiconductor device comprising different types of transistors, wherein, above one transistor type, a relaxation of internal stress may be performed for a plurality of stress-inducing layers, according to still further illustrative embodiments.

FIG. 3e schematically illustrates the semiconductor device 300 according to further illustrative embodiments. As shown, the device may comprise the layers 330A, 330B, which may represent a highly stressed material inducing a first type of strain and a highly stressed material inducing a second type of strain, respectively, wherein the layer 330B may also represent a substantially stress-neutral material, as previously explained. Furthermore, the layer 350A may be formed above the first and second transistors 320A, 320B, followed by the stress-inducing layer 333 and a further interlayer dielectric material 350B. Moreover, a further stress-inducing layer 334 may be provided. It should be appreciated that, in the embodiment shown, the layers 333, 334 may have an internal stress level configured to enhance the performance of the first transistor 320A, which may represent a P-channel transistor. In other cases, the layers 333, 334 may be designed to enhance the performance of the second transistor 320B. Moreover, an implantation mask 372 may be provided to cover the first transistor 320A while exposing the second transistor 320B during an implantation process 373.

It should be appreciated that the layers 333 and 334 may be formed on the basis of process strategies as previously explained so as to respect respective gap-filling capabilities of the corresponding deposition techniques. During the ion implantation 373, appropriate process parameters, such as implantation energy and dose, may be selected for a specific implantation species in order to obtain a significant stress relaxation in the exposed portions of the layers 333, 334. Consequently, a negative impact of these layers on the transistor 320A may be significantly reduced. Thus, the relaxation or stress reduction of the exposed portions of the layers 333, 334 may be accomplished on the basis of a single implantation step, thereby reducing the overall process complexity. It should be appreciated that the process parameters, such as implantation energy, are less critical, since the material 350A may represent an efficient buffer material in order to reduce the stress relaxing effect on the layer 330B, if provided in the form of a highly stressed material.

As a result, the present disclosure relates to techniques and semiconductor devices in which an increased amount of highly stressed material may be provided above transistor elements, even for sophisticated surface geometries, by alternating the depositing of a highly stressed material and an interlayer dielectric material, which may be provided on the basis of a deposition technique having enhanced gap-filling capabilities. Consequently, after the deposition of the intermediate dielectric material, a highly stressed material may be deposited under less strict surface conditions, thereby reducing the probability of creating voids or other defects while nevertheless providing, in total, an increased amount of highly stressed material. The principles disclosed herein may also be applied to different device areas in which respective transistor elements may require a different type or magnitude of strain. For this purpose, stress relaxation and/or a selective removal of one or more of the individual stress-inducing layers may be combined with the deposition of an appropriately stressed dielectric material so as to individually enhance the performance of different transistor types or at least not substantially negatively affect one transistor, while significantly enhancing the performance of another transistor type. For example, a moderately high compressive stress may be provided on the basis of two or more stressed dielectric layers with intermediate dielectric material, such as silicon dioxide, thereby significantly enhancing the performance of P-channel transistors, while nevertheless providing a high degree of compatibility with conventional strategies. The two or more stress-inducing layers may be efficiently used as etch stop materials, thereby also providing enhanced controllability of a respective process for forming contact openings in the final contact layer stack.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a first stress-inducing layer above a first transistor formed above a substrate, said first stress-inducing layer generating a first type of strain in a channel region of said first transistor;
    forming a first interlayer dielectric material above said first stress-inducing layer;
    forming a second stress-inducing layer above said first transistor, said second stress-inducing layer generating said first type of strain in said channel region of said first transistor;
    forming a second interlayer dielectric material above said second stress-inducing layer; and
    forming a contact opening in said first and second interlayer dielectric materials using said first and second stress-inducing layers as etch stop layers, wherein an average thickness of said first interlayer dielectric material is greater than a thickness of said first stress-inducing layer and a thickness of said second stress-inducing layer, respectively.

2. The method of claim 1, wherein said first and second stress-inducing layers are formed by a first deposition technique having a first gap-filling capability and said first and second interlayer dielectric materials are formed by a second deposition technique having a second gap-filling capability that is higher than said first gap-filling capability.

3. The method of claim 2, wherein said first and second stress-inducing layers are formed by a plasma enhanced chemical vapor deposition technique so as to form a silicon and nitrogen containing dielectric material.

4. The method of claim 2, where said first and second interlayer dielectric materials are formed by one of a thermal chemical vapor deposition and a high density plasma enhanced chemical vapor deposition technique on the basis of TEOS (tetra-ethyl orthosilicate).

5. The method of claim 1, further comprising forming a third stress-inducing layer above said second interlayer dielectric material and forming a third interlayer dielectric material above said third stress-inducing layer, said third stress-inducing layer generating said first type of strain in said channel region.

6. The method of claim 5, wherein said contact opening is formed in said third interlayer dielectric material using said third stress-inducing layer as an etch stop layer.

7. The method of claim 1, further comprising forming said second stress-inducing layer above a second transistor and selectively reducing a stress level of said second stress-inducing layer above a portion located above said second transistor.

8. The method of claim 1, further comprising selectively removing said second stress-inducing layer from above a second transistor, forming a further stress-inducing layer above said second transistor, said further stress-inducing layer generating a second type of strain in a channel region of said second transistor, wherein said second type of strain is different from said first type of strain.

9. The method of claim 1, further comprising forming said first stress-inducing layer above a second transistor and selectively reducing a stress level in a portion of said first stress-inducing layer that is located above said second transistor.

10. The method of claim 1, further comprising forming said first stress-inducing layer above a second transistor, selectively removing said first stress-inducing layer from above said second transistor and forming another stress-inducing layer above said second transistor, said another stress-inducing layer generating a second type of strain in said second transistor that differs from said first type of strain.

11. The method of claim 1, wherein a thickness of said first stress-inducing layer is approximately 100 nm or less.

12. The method of claim 11, wherein a thickness of said second stress-inducing layers is approximately 100 nm or less.

13. The method of claim 1, wherein at least one of said first and second stress-inducing layers comprises silicon and carbon.

14. A method, comprising: forming two or more first stress-inducing layers above a first transistor, said two or more first stress-inducing layers generating a first type of strain in a channel region of said first transistor;
- forming an interlayer dielectric material between respective two of said two or more first stress-inducing layers; and
- forming a contact opening connecting to said first transistor, said contact opening extending through said interlayer dielectric material and said two or more first stress-inducing layers, wherein an average thickness of said interlayer dielectric material is greater than a thickness of each of said two of said two or more first stress-inducing layers.

15. The method of claim 14, further comprising forming at least one second stress-inducing layer above a second transistor, said at least one second stress-inducing layer generating a second type of strain in a channel region of said second transistor, said second type of strain differing from said first type of strain.

16. The method of claim 14, further comprising forming at least one of said two or more first stress-inducing layers above a second transistor and selectively reducing a stress level in a portion of said at least one first stress-inducing layer that is located above said second transistor.

17. The method of claim 14, wherein forming said contact opening comprises performing two or more etch processes for patterning respective portions of said interlayer dielectric material located between respective two of said two or more first stress-inducing layers and using each of the two or more stress-inducing layers as an etch stop layer.

18. A semiconductor device, comprising: a first stress-inducing layer positioned above a first transistor and generating a first type of strain in a channel region of said first transistor;
- a first interlayer dielectric material formed above said first stress-inducing layer;
- a second stress-inducing layer formed above said first interlayer dielectric material and generating said first type of strain in said channel region;
- a second interlayer dielectric material formed above said second stress-inducing layer; and
- a contact element extending through said first and second interlayer dielectric materials and said first and second stress-inducing layers, said contact element connecting to a contact region of said first transistor, wherein an average thickness of the first and second interlayer dielectric materials is each greater than a thickness of the first and second stress-inducing layers, respectively.

19. The semiconductor device of claim 18, wherein said first and second stress-inducing layers comprise silicon and at least one of nitrogen and carbon.

20. The semiconductor device of claim 18, wherein said first and second interlayer dielectric materials are comprised of silicon dioxide.

21. The semiconductor device of claim 18, further comprising a second transistor, wherein said first and second stress-inducing layers are formed above said second transistor with a reduced internal stress level.

22. The semiconductor device of claim 18, further comprising a second transistor and at least a third stress-inducing layer, said third stress-inducing layer generating a second type of strain in a channel region of said second transistor that differs from said first type of strain.

23. The method of claim 18, wherein a gate length of said first transistor is approximately 50 nm or less.

* * * * *